United States Patent
Clark, Jr. et al.

(10) Patent No.: US 7,400,015 B1
(45) Date of Patent: Jul. 15, 2008

(54) SEMICONDUCTOR STRUCTURE WITH FIELD SHIELD AND METHOD OF FORMING THE STRUCTURE

(75) Inventors: William F. Clark, Jr., Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/623,164

(22) Filed: Jan. 15, 2007

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ........................ 257/330; 257/329; 257/347; 438/122; 438/479

(58) Field of Classification Search .................. 257/329, 257/330, 347, 393; 438/122, 479
See application file for complete search history.

(56) References Cited

U.S. PATENT DOCUMENTS

| | | | |
|---|---|---|---|
| 5,606,188 A | | 2/1997 | Bronner et al. |
| 6,107,660 A | * | 8/2000 | Yang et al. .................. 257/329 |
| 6,190,985 B1 | | 2/2001 | Buynoski |
| 6,483,223 B2 | | 11/2002 | Samper et al. |
| 6,847,114 B2 | * | 1/2005 | Sett et al. .................... 257/717 |
| 2005/0121734 A1 | * | 6/2005 | Degertekin et al. ......... 257/414 |
| 2008/0067613 A1 | * | 3/2008 | Anderson et al. ........... 257/401 |

* cited by examiner

*Primary Examiner*—Phuc T Dang
(74) *Attorney, Agent, or Firm*—Gibb & Rahman, LLC; Anthony Canale

(57) ABSTRACT

Disclosed is semiconductor structure that incorporates a field shield below a semiconductor device (e.g., a field effect transistor (FET) or a diode). The field shield is sandwiched between upper and lower isolation layers on a wafer. A local interconnect extends through the upper isolation layer and connects the field shield to a selected doped semiconductor region of the device (e.g., a source/drain region of a FET or a cathode or anode of a diode). Current that passes into the device, for example, during back-end of the line charging, is shunted by the local interconnect away from the upper isolation layer and down into the field shield. Consequently, an electric charge is not allowed to build up in the upper isolation layer but rather bleeds from the field shield into the lower isolation layer and into the substrate below. This field shield further provides a protective barrier against any electric charge that becomes trapped within the lower isolation layer or substrate.

8 Claims, 7 Drawing Sheets

SEMICONDUCTOR STRUCTURE WITH FIELD SHIELD AND METHOD OF FORMING THE STRUCTURE

BACKGROUND

1. Field of the Invention

The embodiments of the invention generally relate to semiconductor devices and, more particularly, to a semiconductor structure that incorporates a semiconductor device coupled to a field shield.

2. Description of the Related Art

Silicon-on-insulator (SOI) technology and, particularly, partially depleted SOI technology, is often subject to damage during wafer processing in the back-end of the line (BEOL) sectors. Specifically, charging of metal lines in processing tools can pass a current from the on-wafer wires through semiconductor devices and into the buried oxide (BOX) before exiting the substrate wafer. The presence of this current in the BOX can lead to a trapped electronic charge. The trapped electronic charge in the BOX can alter the electrical properties of the semiconductor devices and, thereby, degrade yield and/or reliability of circuits. Therefore, there is a need in the art for a semiconductor structure and a method of forming the structure that avoids the build up of an electric charge in the BOX during BEOL processing.

SUMMARY

In view of the foregoing, disclosed herein are embodiments of a semiconductor structure that incorporate a field shield below a semiconductor device (e.g., below a field effect transistor (FET) or a diode). The field shield is sandwiched between upper and lower isolation layers on a wafer. A local interconnect extends through the upper isolation layer and connects the field shield to a doped semiconductor region of the semiconductor device (e.g., a source/drain region of a FET or a cathode or anode of a diode). Current that passes into the device during back-end of the line (BEOL) charging is shunted by the local interconnect away from the upper isolation layer and into the field shield. Consequently, an electric charge is not allowed to build up in the upper isolation layer but rather bleeds into the lower isolation layer and into the substrate below. This field shield further functions as a protective barrier from any electric charge that is trapped within the lower isolation layer or substrate.

More particularly, embodiments of the semiconductor structure of the invention comprise a first isolation layer on a substrate, a conductive pad (i.e., a field shield) on the first isolation layer and a second isolation layer on the conductive pad. The conductive pad is electrically isolated from the substrate. The structure can further comprise a device above the second isolation layer. The device can comprise doped semiconductor regions and one of these doped semiconductor regions can be electrically coupled to the conductive pad by a local interconnect.

For example, the device can comprise a field effect transistor with doped source/drain regions and one of the source/drain regions can be electrically coupled to the conductive pad. Alternatively, the device can comprise a pn junction diode with a doped anode and a doped cathode and either the anode or the cathode can be electrically coupled to the conductive pad.

The local interconnect can comprise a conductor. Specifically, this conductor can be located adjacent to a selected doped semiconductor region (i.e., adjacent to a source/drain region of a field effect transistor or adjacent to an anode or cathode of a diode) and can extend vertically through the second isolation layer to the conductive pad such that it electrically couples the conductive pad to the selected doped semiconductor region. This local interconnect (i.e., the conductor) will shunt current that passes into the device to the conductive pad so as to prevent the build up of an electric charge in the second isolation layer. The conductive pad will further protect the device from any electric charge that is built up in the first isolation layer and the substrate.

The conductive pad and the conductor can each comprise a suitable conductive material, for example, a doped polysilicon or a conductive metal. Additionally, the structure can comprise a metal strap that bridges both the conductor and the doped semiconductor region, thereby allowing current to flow easily between the device and local interconnect to the field shield even if the conductor and the adjacent doped semiconductor region of the device are doped with different type dopants.

Embodiments of a method of forming a semiconductor structure, as described above, comprise providing a wafer with a first isolation layer on a substrate, a conductive layer on the first isolation layer, a second isolation layer on the conductive layer and a semiconductor layer on the second isolation layer.

A trench is patterned and etched in the wafer through the semiconductor layer to the first isolation layer so as to form a stack, including the semiconductor layer, the second isolation layer and conductive layer, on the first isolation layer.

A sidewall spacer is formed adjacent to a sidewall of the stack. In one embodiment of the invention the sidewall spacer can be formed with a dielectric material. After the dielectric sidewall spacer is formed, the remaining portion of the trench is filled with another different dielectric material. The dielectric sidewall spacer is then selectively removed to create an opening adjacent to a selected sidewall of the stack and a conductor (e.g., a doped polysilicon or a conductive metal) is deposited to fill the opening. Alternatively, the sidewall spacer can be formed with a conductor (e.g., a doped polysilicon) and then, the remaining portion of the trench is filled with a dielectric material.

Then, a semiconductor device (e.g., a field effect transistor or a diode) is formed in the stack above the second isolation layer. Specifically, a semiconductor device is formed so that a doped semiconductor region of the device is formed in the semiconductor layer adjacent to the conductor. For example, a field effect transistor can be formed with doped source/drain regions in the semiconductor layer such that one of the source/drain regions is adjacent to the conductor. Alternatively, a diode can be formed with a doped anode and a doped cathode in the semiconductor layer such that either the anode or the cathode is adjacent to the conductor.

Additionally, to ensure that current passing into the device is allowed to flow easily between the conductor and the adjacent doped semiconductor region, a metal strap can be formed above both the conductor and the doped semiconductor region providing a bridge for current flow.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS OF THE INVENTION

Figure 1:
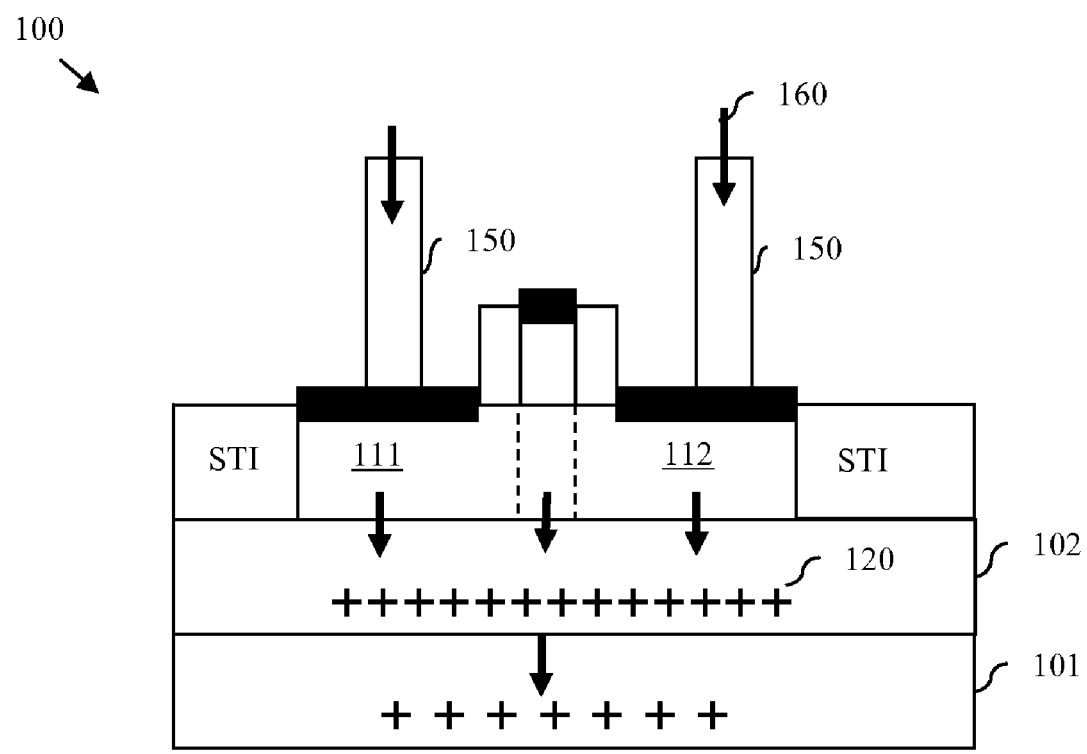
FIG. 1 is a schematic diagram illustrating a semiconductor structure.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, silicon-on-insulator (SOI) technology and, particularly, partially depleted SOI technology, is often subject to damage during wafer processing in the back-end of the line (BEOL) sectors. Specifically, referring to FIG. 1, during fabrication of semiconductor devices 100 (e.g., field effect transistors (as shown), pn junction diodes, etc.), charging of metal lines in processing tools can pass a current 160 from on-wafer wires 150 through the semiconductor devices 100 and, particularly, through the doped semiconductor regions of the devices 100 (e.g., through the source/drain regions 111 and 112 of a field effect transistor (as shown) or the anode and cathode of a pn junction diode) and into the buried oxide (BOX) layer 102 below before exiting the substrate wafer 101. The presence of this current in the BOX 102 can lead to a trapped electronic charge 120. The trapped electronic charge 120 can alter the electrical properties of the semiconductor devices 100 and, thereby degrade yield and/or reliability of integrated circuits.

Previously, field shields have been incorporated into semiconductor devices in order to "harden" them against radiation strikes. Specifically, the state of semiconductor devices (e.g., transistors or diodes) can change due to radiation strikes at a sensitive node. Field shields have been incorporated into such devices in order to resist state changes due to such radiation strikes.

Disclosed herein are embodiments of a semiconductor structure that improves circuit yield and reliability by incorporating a field shield configured to both avoid the build up of an electric charge in the isolation layer immediately below the device during BEOL processing and to protect the device from charges trapped in the wafer substrate. Specifically, the embodiments of the semiconductor structure of the invention incorporate a field shield below a semiconductor device (e.g., below a field effect transistor (FET) or a pn junction diode). The field shield is sandwiched between upper and lower isolation layers on a wafer. A local interconnect extends through the upper isolation layer and connects the field shield to a selected doped semiconductor region of the semiconductor device (e.g., a source/drain region of a FET or a cathode or anode of a pn junction diode). Current that passes into the device, for example, during back-end of the line (BEOL) charging, is shunted by the local interconnect away from the upper isolation layer and down into the field shield. Consequently, an electric charge is not allowed to build up in the upper isolation layer but rather bleeds from the field shield into the lower isolation layer and into the substrate below. This field shield further provides a protective barrier against any electric charge that becomes trapped within the lower isolation layer or substrate.

More particularly, embodiments of the semiconductor structure of the invention (see structure 200 of FIG. 2 and structure 300 of FIG. 3) comprise a first isolation layer 203 on a substrate 201, a conductive pad 230 (i.e., a field shield) on the first isolation layer 203 and a second isolation layer 204 on the conductive pad 230. The structure 200, 300 can further comprise a device (e.g., see a field effect transistor 275 of FIG. 2 or a pn junction diode 375 of FIG. 3) above the second isolation layer 204. The device can comprise doped semiconductor regions and one of these doped semiconductor regions can be electrically coupled to the conductive pad 230 by a local interconnect 235. Shallow trench isolation structures 205 border the sides of the device and extend through the pad conductive pad 230 to the first isolation layer 203, thereby electrically isolating the device and the conductive pad 230 from the substrate 201.

Figure 2:
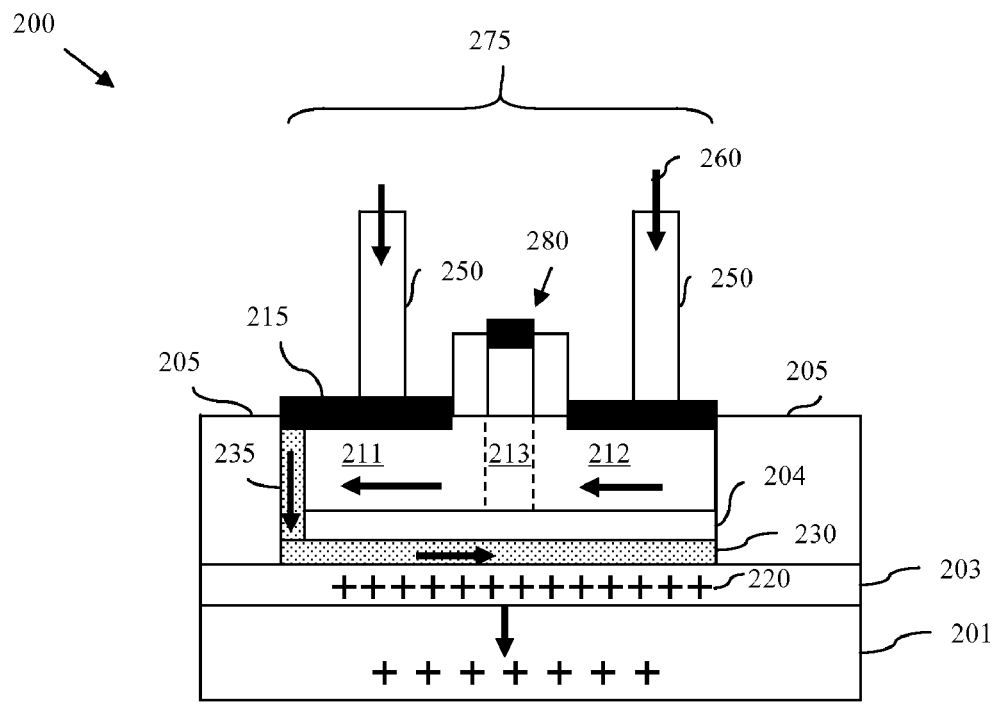
FIG. 2 is a schematic diagram illustrating an embodiment of the semiconductor structure of the invention.

Specifically, referring to FIG. 2, the device 275 can comprise an n-type or p-type field effect transistor (FET) with a semiconductor layer (e.g., within a silicon layer) above the second isolation layer 204. The semiconductor layer can comprise doped source/drain regions 211-212 adjacent to a channel region 213. Specifically, a p-type field effect transistor can comprise a channel region 213 that is lightly doped with an n-type dopant (e.g., phosphorus (P), arsenic (As) or antimony (Sb)) and source/drain regions 211-212 that are heavily doped with p-type dopant (e.g., boron (B)). Whereas, an n-type field effect transistor can comprise a channel region 213 that is lightly doped with a p-type dopant (e.g., boron (B)), and source/drain regions 211-311 that are heavily doped with an n-type dopant (e.g., phosphorus (P), arsenic (As) or antimony (Sb)). Regardless of whether the FET comprises an n-FET or p-FET, one of these source/drain regions (e.g., see source/drain region 211) can be electrically coupled to the conductive pad 230. The FET 275 can further comprise a gate 280 (i.e., a gate dielectric and gate conductor stack) above the channel region 213 of the semiconductor layer.

Figure 3:
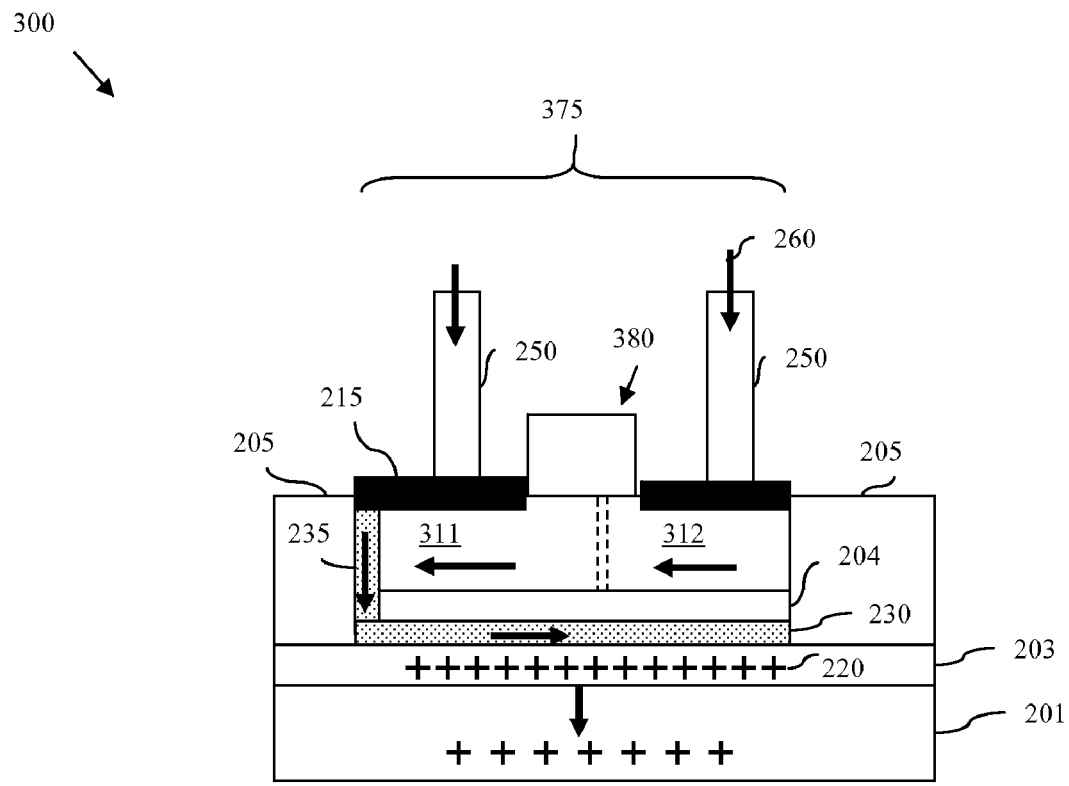
FIG. 3 is a schematic diagram illustrating another embodiment of the semiconductor structure of the invention.

Alternatively, referring to FIG. 3, the device 375 can comprise a pn junction diode with an anode and a cathode (311-312) within a semiconductor layer (e.g., within a silicon layer) above the second isolation layer 204. That is, the diode 375 can comprise a semiconductor layer with two adjacent semiconductor regions 311-312 that are doped with different type dopants. One region can comprise a cathode region that is doped with an n-type dopant (e.g., phosphorus (P), arsenic (As) or antimony (Sb)) and another region can comprise an anode region that is doped with a p-type dopant (e.g., boron (B)). Either the anode or the cathode (e.g., see region 311)) can be electrically coupled to the conductive pad 230. The FET 375 can further comprise an isolation structure 380 (e.g., a non-functional gate, nitride pad, etc.). Those skilled in the art will recognize that, during the formation process, this isolation structure 380 allows for multi-step masked doping of the anode and cathode regions.

The local interconnect 235 can comprise a conductor. Specifically, this conductor 235 can be located adjacent to a selected one of the doped semiconductor regions. That is, the conductor 235 can be adjacent to one of the source/drain regions 211-212 of a field effect transistor 275 of FIG. 2 or adjacent to an anode or cathode 311-312 of a diode 375 of FIG. 3. The conductor 235 can further extend vertically through the second isolation layer 204 to the conductive pad 230 such that it electrically couples the conductive pad 230 to the selected doped semiconductor region. This local interconnect 235 (i.e., the conductor) will shunt current (as illustrated by arrows 260) that passes into the device (e.g., into the FET 275 of FIG. 2 or diode 375 of FIG. 3) to the conductive pad 230 so as to prevent build up of an electric charge 220 in the second isolation layer 204. As discussed above, without such a field shield current passing into the device would bleed into the isolation layer immediately below the device, thereby trapping an electric charge in the isolation layer and effecting circuit yield and reliability. Rather with the field shield 230 of the present invention, the current 260 passes from the local interconnect 235 into the field shield 230 and is allowed to bleed off into the first isolation layer 203 and into the substrate 201. Thus, electric charge 220 is only allowed to build up in the first isolation layer 203. The conductive pad 230 will further protect the device (e.g., the FET 275 of FIG. 2 or diode 375 of FIG. 3) from any electric charge 220 that may be built up in the first isolation layer 203 and/or the substrate 201 (i.e., provides a protective barrier from such a trapped electric charge 220) during BEOL processing or by any other means.

The isolation layers 203 and 204 can comprise, for example, buried oxide layers, such as silicon dioxide ($SiO_2$) layers within bonded silicon-on-insulator (SOI) wafers.

The conductive pad 230 and the conductor 235 can each comprise a suitable conductive material, for example, a doped (n-type or p-type) polysilicon or a conductive metal (e.g., tungsten (W), etc.). Additionally, the structure 200 of FIG. 2 or 300 of FIG. 3 can comprise a metal strap 215 (e.g., a metal silicide strap, such as a nickel, titanium or cobalt silicide strap) that bridges both the conductor 235 and the adjacent doped semiconductor region (i.e., region 211 of FIG. 2 or 311 of FIG. 3), thereby allowing current 260 to flow easily between the device (i.e., FET 275 of FIG. 2 or diode 375 of FIG. 3) and local interconnect 235 to the field shield 230. Specifically, such a metal strap 215 avoids the blockage of current flow that results if the conductor 235 and the adjacent semiconductor region 211, 311 comprise are doped with different type dopants, thereby creating a diode.

It is further anticipated that the structure 200, 300 of the invention can be incorporated into integrated circuits comprising multiple devices. For example, each FET of a complementary metal oxide semiconductor (CMOS) device can be electrically coupled to a corresponding field shield in order to increase yield and reliability.

Figure 4:
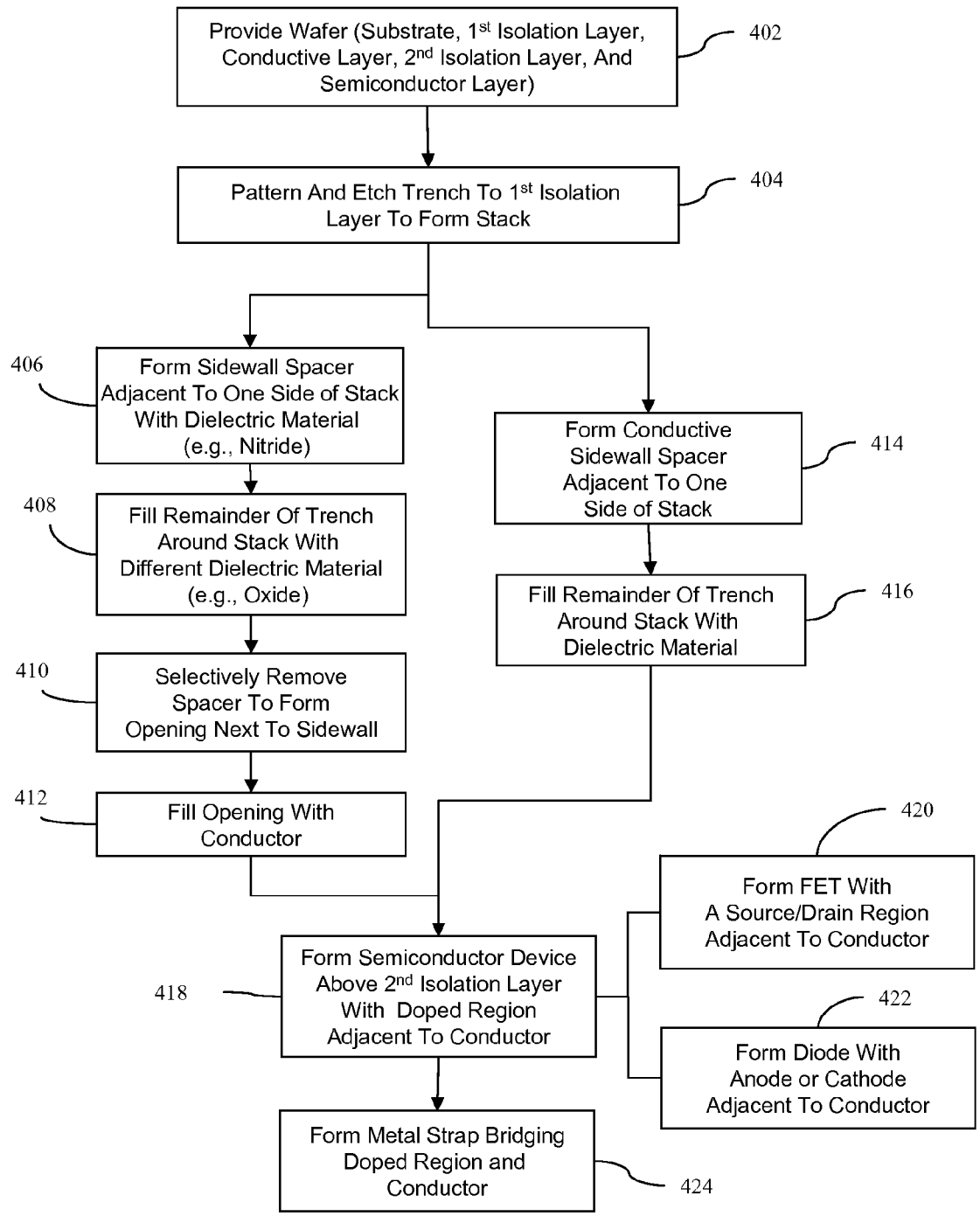
FIG. 4 is a flow diagram illustrating embodiment of a method of the invention.
Figure 5:
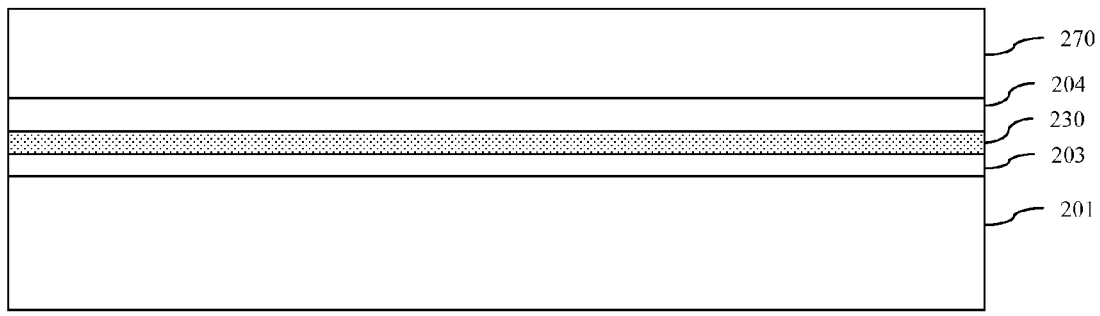
FIG. 5 is a schematic diagram illustrating a partially completed structure of the invention.

Referring to FIG. 4, embodiments of a method of forming a semiconductor structure 200 or 300 of the invention, as described above and illustrated in FIGS. 2 and 3, respectively, comprise providing a wafer with a first isolation layer 203 on a substrate 201 (e.g., a silicon substrate), a conductive layer 230 on the first isolation layer 203, a second isolation layer 204 on the conductive layer 230 and a semiconductor layer 270 on the second isolation layer 204 (402, see FIG. 5). The isolation layers 203-204 can, for example, comprise silicon dioxide ($SiO_2$) layers. The conductive layer 230 can, for example, comprise a conductive material, such as a polysilicon layer heavily doped with an n-type or p-type dopant or a conductive metal layer.

Such a wafer can be formed using known processing techniques to bond the insulator layers of two silicon-on-insulator wafers with a doped polysilicon layer. For example, two wafers can be provided, each of which comprises a silicon dioxide ($SiO_2$) layer on a silicon (Si) substrate. Onto the silicon dioxide layer of one of the wafers a polysilicon layer can be deposited followed by a second silicon dioxide layer. Then, the two wafers can be bonded such that cohesive forces hold the top silicon dioxide layers from each wafer together. Then, the silicon surface of one of the wafers can be polished to a desired silicon film thickness.

Figure 6:
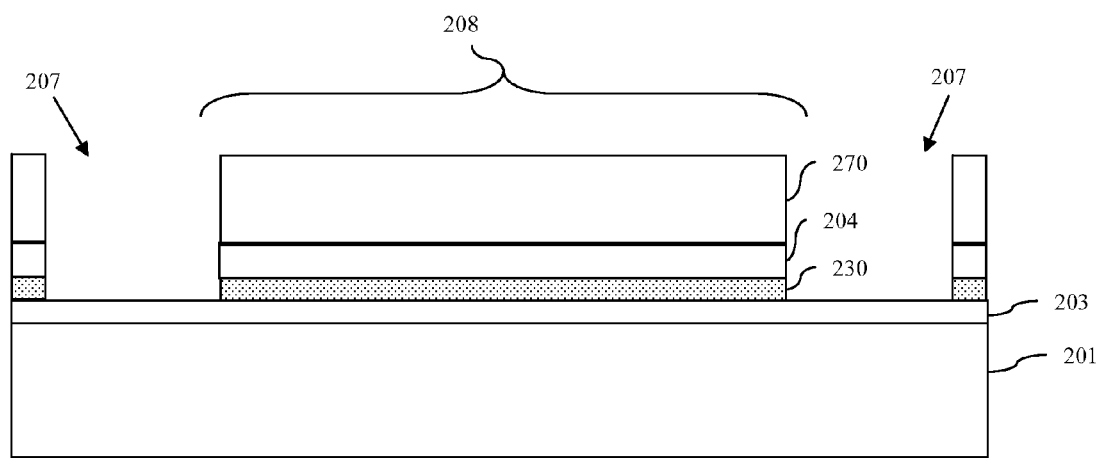
FIG. 6 is a schematic diagram illustrating a partially completed structure of the invention.

A trench 207 is patterned and etched in the wafer through the semiconductor layer 270 to the first isolation layer 203 so as to form a stack 208, including the semiconductor layer 270, the second isolation layer 204 and conductive layer 230, on the first isolation layer 203 (404, see FIG. 6). The trench 207 can be formed, for example, using conventional lithographic patterning techniques and a multi-step reactive ion etching (RIE) process.

Figure 7:
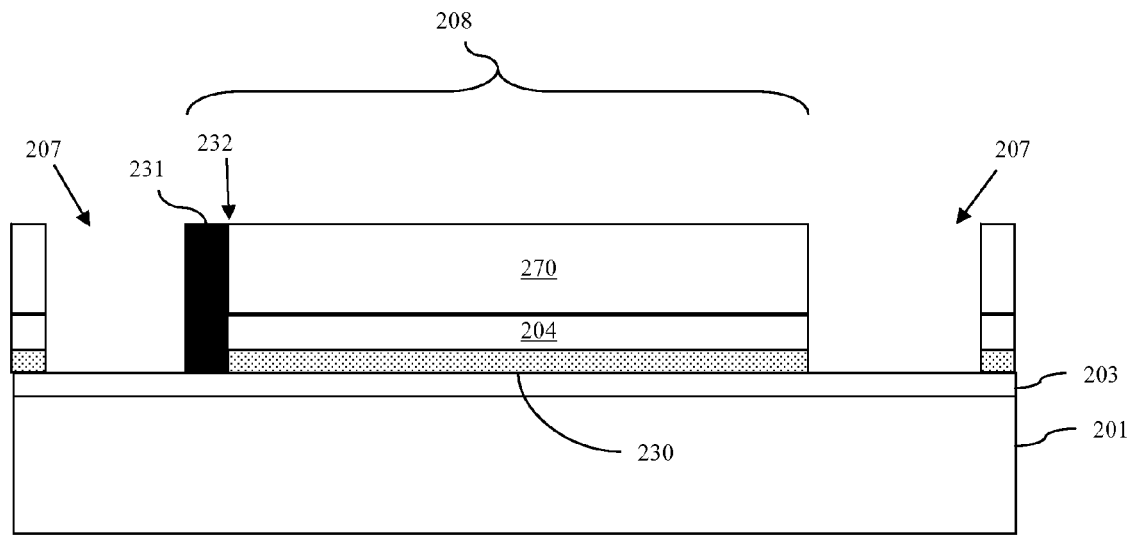
FIG. 7 is a schematic diagram illustrating a partially completed structure of the invention.

A dielectric sidewall spacer 231 can be formed adjacent to a selected sidewall 232 of the stack 208 (406, see FIG. 7). The sidewall spacer 231 can be formed with a first dielectric material (e.g., a nitride or any other suitable dielectric material). This sidewall spacer 231 may be formed by first forming sidewall spacers on all of the sidewalls within the trench 207. A mask layer is then formed above the structure such that all of the formed sidewall spacers within the trench 207 other than the sidewall spacer 231 that is adjacent to the selected sidewall 232 of the stack 208 are exposed. The exposed sidewalls spacers are then selectively removed, followed by removal of the mask layer.

Figure 8:
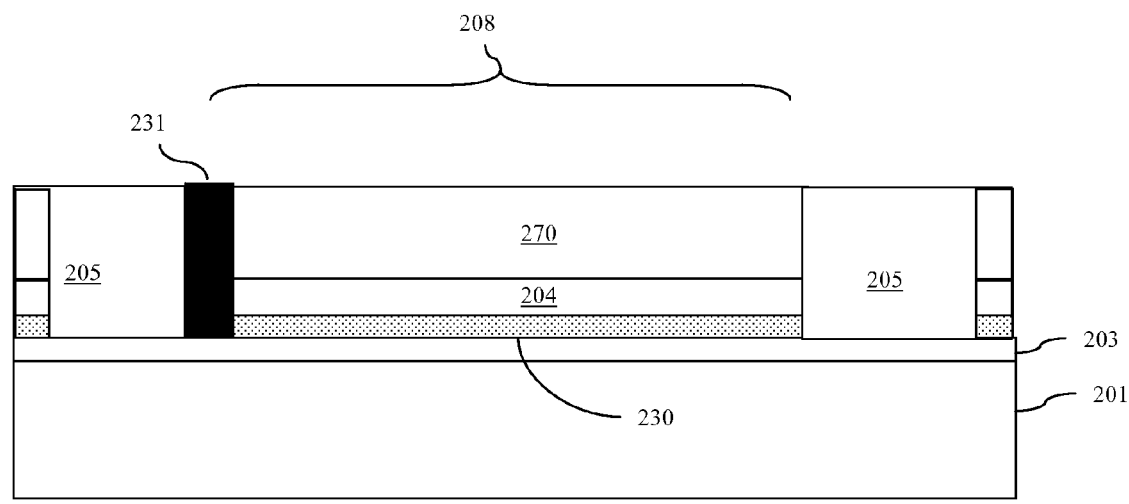
FIG. 8 is a schematic diagram illustrating a partially completed structure of the invention.
Figure 9:
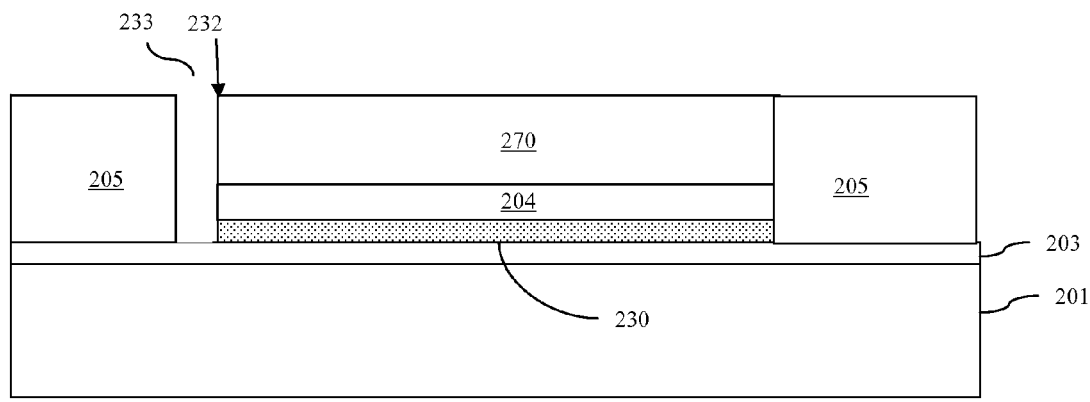
FIG. 9 is a schematic diagram illustrating a partially completed structure of the invention.
Figure 10:
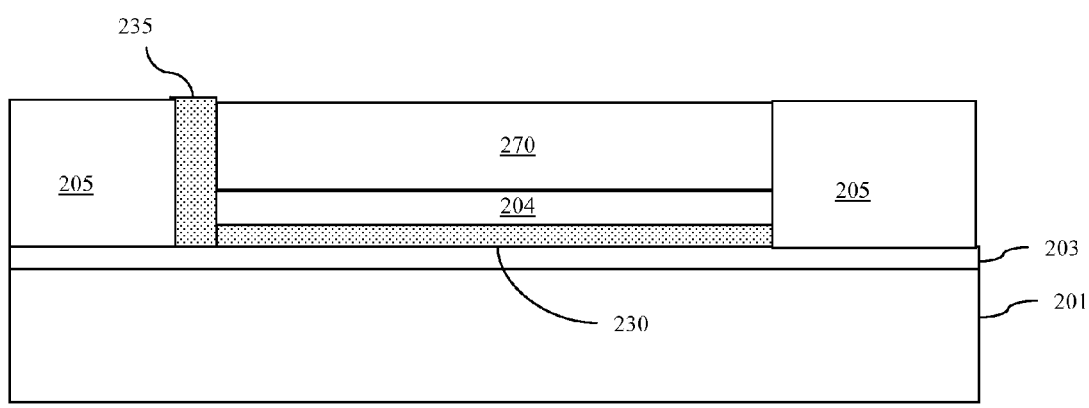
FIG. 10 is a schematic diagram illustrating a partially completed structure of the invention.

After the dielectric spacer 231 is formed, another dielectric layer (e.g., an oxide, such as silicon dioxide ($SiO_2$) or another dielectric material that is different from that used to form the dielectric sidewall spacer 231) is deposited and planarized such that the remaining portion of the trench 207 is filled (408, see FIG. 8). Thus, a shallow trench isolation (STI) structure 205 is formed around the stack 208 and adjacent to the spacer 231 on one side of the stack 208. The STI 205 in combination with the first isolation layer 203 isolates the semiconductor layer 270 from the substrate 201. The sidewall spacer 231 is then removed (e.g., using a selective etch process) to create an opening 233 adjacent to the selected sidewall 232 of the stack (410, see FIG. 9). Once the spacer 231 is selectively removed, a conductive material (e.g., a doped polysilicon or a conductive metal) is deposited and planarized, thereby filling the opening 233 with a conductor 235 that contacts the conductive pad 230 with the stack 208 (412, see FIG. 10).

Figure 11:
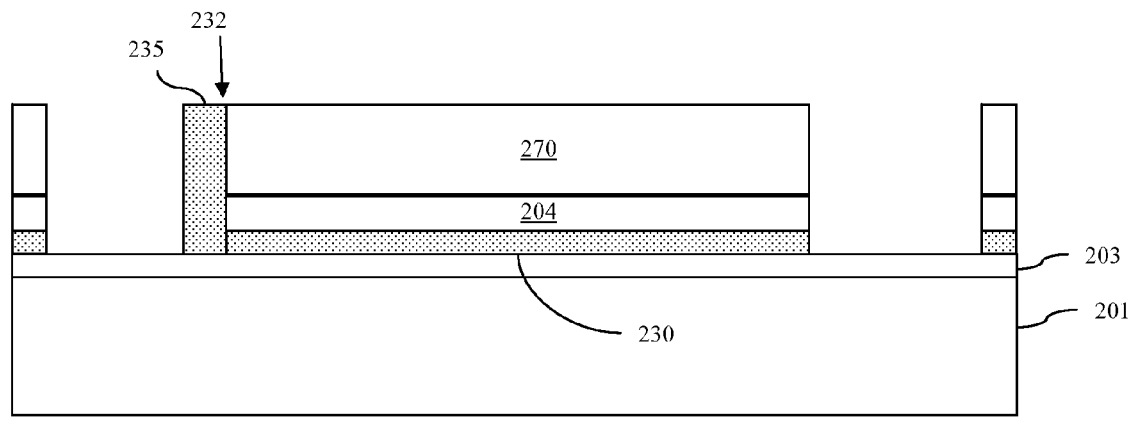
FIG. 11 is a schematic diagram illustrating a partially completed structure of the invention.

Alternatively, a conductive material (e.g., a doped polysilicon or conductive metal) can be used to form a conductive sidewall spacer (i.e., conductor 235) directly on a selected sidewall 232 of the stack 208 (414, see FIG. 11). As with the spacer 231 described above, the conductive sidewall spacer 235 may be formed adjacent to the selected sidewall 232 of the stack 208 by first forming conductive sidewall spacers on all of the sidewalls within the trench 207. A mask layer is then formed above the structure such that all of the trench sidewall spacers other the spacer that is adjacent to the selected sidewall 232 of the stack 208 are exposed. The exposed sidewalls spacers are then selectively removed, followed by removal of the mask layer.

Figure 12:
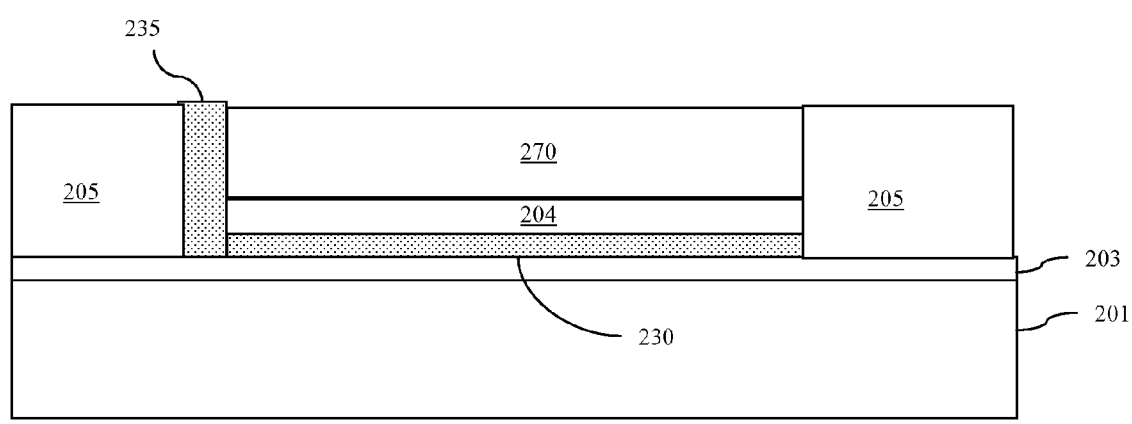
FIG. 12 is a schematic diagram illustrating a partially completed structure of the invention.

After the conductive sidewall spacer 235 (i.e., the conductor) is formed adjacent to a selected sidewall 232 of the stack 208, a dielectric layer (e.g., an oxide, such as silicon dioxide (SiO$_2$)) is deposited and planarized such that the remaining portion of the trench 207 is filled (416, see FIG. 12). Thus, a shallow trench isolation (STI) structure 205 is formed around the stack 208 and adjacent to the conductor 235 on one side of the stack 208. The STI 205 in combination with the first isolation layer 203 isolates the semiconductor layer 270 from the substrate 201.

Then, a semiconductor device is formed above the second isolation layer 204 (418, see FIGS. 2 and 3). Specifically, a semiconductor device is formed (e.g., using conventional processing techniques) so that a doped semiconductor region of the device is formed in the semiconductor layer 270 adjacent to the conductor.

For example, as illustrated in FIG. 2, a field effect transistor 275 can be formed (420) by forming a gate 280 above a channel region 213 within the semiconductor layer 270. Doped source/drain regions 211-212 can be formed on either side of the channel region 213 within the semiconductor layer 270. Specifically, for a p-type field effect transistor, the semiconductor layer 270 in the wafer can be lightly doped with an n-type dopant (e.g., phosphorus (P), arsenic (As) or antimony (Sb)). Then, the semiconductor layer 270 on either side of the gate and, thus, on either side of the channel region 213 is implanted with a high concentration of a p-type dopant (e.g., boron (B)). Consequently, the p-type source/drain regions 211-212 are formed such that one of the source/drain regions (e.g., 211) is adjacent to the conductor 235. Similarly, for an n-type field effect transistor, the semiconductor layer 270 in the wafer can be lightly doped with a p-type dopant (e.g., boron (B)). Then, the semiconductor layer 270 on either side of the gate and, thus, on either side of the channel region 213 is implanted with a high concentration of an n-type dopant (e.g., phosphorus (P), arsenic (As) or antimony (Sb)). Consequently, n-type source/drain regions 211-212 are formed such that one of the source/drain regions (e.g., 211) is adjacent to the conductor 235.

Alternatively, as illustrated in FIG. 3, a diode 375 can be formed (422) by forming an isolation structure 380 (e.g., a non-functional gate, a nitride pad, etc.) over a center portion of the semiconductor layer 270. Adjacent regions 311, 312 within the semiconductor layer 270 can be doped with high concentrations of different type dopants, e.g., using a masked implantation process. That is, a cathode region can be formed by implanting a high concentration of n-type dopants (e.g., phosphorus (P), arsenic (As) or antimony (Sb)) into one portion of the semiconductor layer 270 and an anode region can be formed by implanting a high concentration of p-type dopants (e.g., boron (B)) into an adjacent portion of in the semiconductor layer 270. One of these doped semiconductor regions (i.e., either the anode or the cathode) can be formed adjacent to the conductor 235.

Additionally, those skilled in the art will recognize that if the conductor 235 comprises polysilicon doped with one type of dopant (e.g., a p-type dopant) and the adjacent doped semiconductor region (e.g., region 211 of FIG. 2 or region 311 of FIG. 3) is doped with a different type dopant (e.g., an n-type dopant), then a diode is formed which will obstruct current flow to the field shield. Therefore, in order to ensure that current 260 is allowed to flow easily between the doped semiconductor region (e.g., region 211 of FIG. 2 or region 311 of FIG. 3) and the adjacent conductor 235, a metal strap or bridge 215 can be formed.

For example, a metal silicide (e.g., a titanium, nickel or cobalt silicide) can be formed above both the doped semiconductor regions of the FET or diode and above the doped polysilicon conductor (i.e., above the local interconnect). To form the metal silicide, a self-aligned metal silicide process can be performed. That is, a metal (e.g., Ni, Ti, Co, etc.) can be deposited over the structure and, particularly, over the exposed top surface of the doped semiconductor regions (e.g., over regions 211-212 of FIG. 2 or regions 311-312 of FIG. 3), over the doped polysilicon conductor 235 and over the gate/isolation structure (e.g., over the gate 280 of FIG. 2 or the isolation structure 380 of FIG. 3). The metal is annealed causing a reaction which forms the metal silicide at the silicon/metal junctions above the doped semiconductor regions, above the polysilicon conductor and also above the gate/isolation structure, if that structure comprises polysilicon. Any unreacted metal and byproducts are then removed.

Therefore, disclosed above are embodiments of a semiconductor structure that improve circuit yield and reliability by incorporating a field shield configured to both avoid the build up of an electric charge in the isolation layer immediately below the device during BEOL processing and to protect the device from charges trapped in the wafer substrate. Specifically, the embodiments of the semiconductor structure of the invention incorporate a field shield below a semiconductor device (e.g., below a field effect transistor (FET) or a pn junction diode). The field shield is sandwiched between upper and lower isolation layers on a wafer. A local interconnect extends through the upper isolation layer and connects the field shield to a selected doped semiconductor region of the semiconductor device (e.g., a source/drain region of a FET or a cathode or anode of a pn junction diode). Current that passes into the device, for example, during back-end of the line (BEOL) charging, is shunted by the local interconnect away from the upper isolation layer and down into the field shield. Consequently, an electric charge is not allowed to build up in the upper isolation layer but rather bleeds from the field shield into the lower isolation layer and into the substrate below. This field shield further provides a protective barrier against any electric charge that becomes trapped within the lower isolation layer or substrate. Thus, it is ideally suited for any charge inducing environment.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the described embodiments of the invention can be practiced with modification within the spirit and scope of the appended claims.

What is claimed is:

1. A semiconductor structure comprising:
  a substrate;

a first isolation layer on said substrate;

a conductive pad on said first isolation layer;

a second isolation layer on said conductive pad;

a device, having a doped semiconductor region, on said second isolation layer, wherein said conductive pad is electrically coupled to said doped semiconductor region and electrically isolated from said substrate; and a conductor that is adjacent to said doped semiconductor region, that extends vertically through said second isolation layer to said conductive pad and that electrically couples said conductive pad to said doped semiconductor region, wherein said conductor shunts current passing through said device to said conductive pad so as to prevent build up of an electric charge in said second isolation layer, and wherein said conductive pad protects said device from any electric charge built up in said first isolation layer and said substrate.

2. The semiconductor structure of claim 1, wherein said device comprises a field effect transistor and wherein said doped semiconductor region comprises a source/drain region of said field effect transistor.

3. The semiconductor structure of claim 1, wherein said device comprises a diode and wherein said doped semiconductor region comprises one of an anode and a cathode of said diode.

4. The semiconductor structure of claim 1, wherein said conductive pad and said conductor each comprise one of a doped polysilicon and a conductive metal.

5. The semiconductor structure of claim 1, further comprising a metal strap adjacent to said conductor and said doped semiconductor region.

6. A semiconductor structure comprising:

a substrate;

a first isolation layer on said substrate;

a conductive pad on said first isolation layer;

a second isolation layer on said conductive pad;

a field effect transistor, having source/drain regions, on said second isolation layer, wherein said conductive pad is electrically coupled to one of said source/drain regions and electrically isolated from said substrate; and a conductor that is adjacent to said one of said source/drain regions, that extends vertically through said second isolation layer to said conductive pad and that electrically couples said conductive pad to said one of said source/drain regions, wherein said conductor shunts current passing through said field effect transistor to said conductive pad so as to prevent build up of an electric charge in said second isolation layer, and wherein said conductive pad protects said field effect transistor from any electric charge built up in said first isolation layer and said substrate.

7. The semiconductor structure of claim 6, wherein said conductive pad and said conductor each comprise one of a doped polysilicon and a conductive metal.

8. The semiconductor structure of claim 6, further comprising a metal strap adjacent to said conductor and said one of said source/drain regions.

* * * * *